US008792272B2

(12) United States Patent  (10) Patent No.: US 8,792,272 B2
Bandic et al.  (45) Date of Patent: Jul. 29, 2014

(54) IMPLEMENTING ENHANCED DATA PARTIAL-ERASE FOR MULTI-LEVEL CELL (MLC) MEMORY USING THRESHOLD VOLTAGE-DRIFT OR RESISTANCE DRIFT TOLERANT MOVING BASELINE MEMORY DATA ENCODING

(75) Inventors: Zvonimir Z. Bandic, San Jose, CA (US); Luiz M. Franca-Neto, Sunnyvale, CA (US); Cyril Guyot, San Jose, CA (US); Robert Eugeniu Mateescu, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 353 days.

(21) Appl. No.: 13/361,925

(22) Filed: Jan. 30, 2012

(65) Prior Publication Data

US 2013/0198436 A1    Aug. 1, 2013

(51) Int. Cl.
*G11C 11/34* (2006.01)
*G11C 16/04* (2006.01)

(52) U.S. Cl.
USPC ............ 365/185.03; 365/185.09; 365/148; 365/218; 365/222

(58) Field of Classification Search
CPC .... G11C 11/56; G11C 11/5678; G11C 13/00; G11C 13/0004; G11C 13/0097; G11C 16/04; G11C 16/16; G11C 16/349; H01L 45/06; H03M 5/14; G06F 12/0246
USPC ............ 365/185.09, 185.03, 185.29, 185.25, 365/148, 163, 218, 222
See application file for complete search history.

(56) References Cited

U.S. PATENT DOCUMENTS

| 7,333,364 | B2 | 2/2008 | Yu et al. | |
| 7,532,520 | B2 * | 5/2009 | Yanagidaira et al. | 365/185.29 |
| 7,990,771 | B2 * | 8/2011 | Hwang et al. | 365/185.19 |
| 8,508,990 | B2 * | 8/2013 | Cho et al. | 365/185.03 |
| 2004/0114431 | A1 * | 6/2004 | Shona | 365/185.11 |

(Continued)

FOREIGN PATENT DOCUMENTS

| EP | 1746604 A1 | 1/2007 |
| IL | WO2007132452 A2 | 11/2007 |
| IL | WO2008053472 A2 | 5/2008 |
| IL | WO2012023102 A1 | 2/2012 |

OTHER PUBLICATIONS

Zhang et al., "Helmet: A Resistance Drift Resilient Architecture for Multi-level Cell Phase Change Memory System", 2011 IEEE/IFIP 41st International Conference on Dependable Systems & Networks (DSN), Jun. 27-30, 2011, Hong Kong, China, pp. 197-208, ISBN 978-1-4244-9232-9 (IEE, INSPEC A/N 12122044).

(Continued)

*Primary Examiner* — Toan Le
(74) *Attorney, Agent, or Firm* — Joan Pennington

(57) ABSTRACT

A method and apparatus are provided for implementing enhanced data partial erase for multi-level cell (MLC) memory using threshold-voltage-drift or resistance-drift tolerant moving baseline memory data encoding. A data partial erase for data written to the MLC memory using threshold-voltage-drift or resistance-drift tolerant moving baseline memory data encoding is performed, and a data re-write after the partial erase to the MLC memory is performed using threshold-voltage-drift or resistance-drift tolerant moving baseline memory data encoding. A data partial erase cycle includes a duration and voltage level based upon a degradation of the MLC memory cells.

20 Claims, 30 Drawing Sheets

(56) References Cited

U.S. PATENT DOCUMENTS

| | | |
|---|---|---|
| 2009/0132758 A1 | 5/2009 | Jiang et al. |
| 2009/0300465 A1 | 12/2009 | Wu et al. |
| 2010/0070799 A1 | 3/2010 | Cornwell et al. |
| 2010/0290282 A1 | 11/2010 | Huang et al. |
| 2011/0072191 A1 | 3/2011 | Huang et al. |
| 2011/0170349 A1 | 7/2011 | Avraham et al. |
| 2011/0307764 A1 | 12/2011 | Tsai et al. |

OTHER PUBLICATIONS

Berman et al., "Constrained Flash Memory Programming", Proceedings of 2011 IEEE International Symposium on Information Theory—ISIT, Jul. 31-Aug. 2011, pp. 2128-2132, ISBN 978-1-4577-0596-0 (INSPEC A/N 12300245).

"Rank Modulation for Flash Memories" nu Anxiao Jian et al., IEEE Transactions on Information Theory, vol. 55, No. 6, June 2009.

"Multiple-Write WOM-Codes" by Scott Kayse et al., Forty-Eighth Annual Allerton Conference Allerton House, UIUC, Illinois, USA, Sep. 29-Oct. 1, 2010, pp. 1062-1068.

"Characterizing Flash Memory: Anomalies, Observations, and Applications" by Laura M. Grupp et al., Micro'09, Dec. 12-16, 2009, New York, NY, USA., Copyright 2009 ACM 978-1-60558-798-1/09/12.

"Run-length limited", Wikipedia, the free encyclopedia, http://en.wikipedia.org/wiki/Run-length_limited[Dec. 2, 2011 3:13:18 PM].

"IBM reports drift-tolerant multilevel cell PCM", by Peter Clarke, Jun. 30, 2011, http://www.eetimes.com/General/DisplayPrintViewContent/4217373.

\* cited by examiner

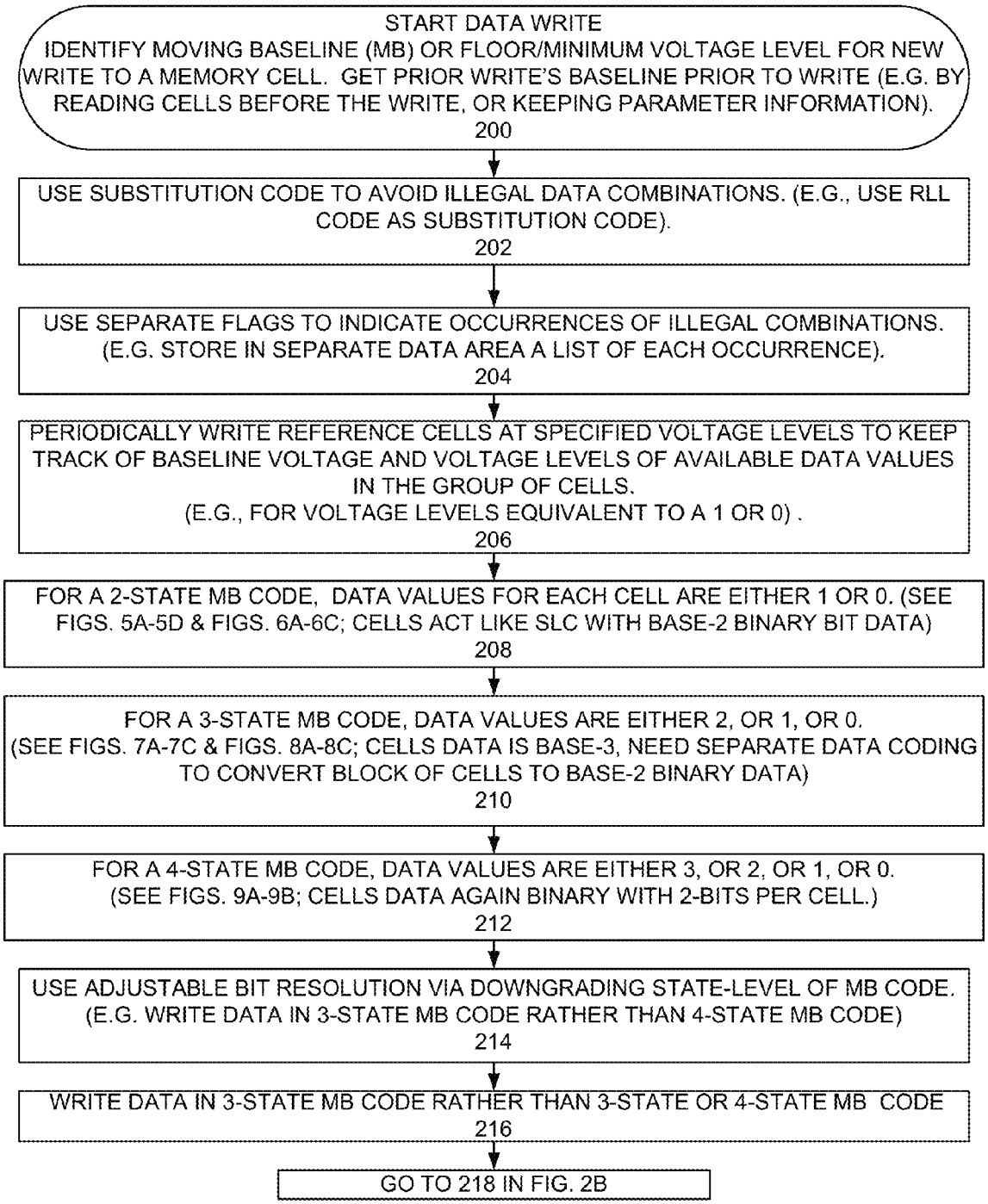

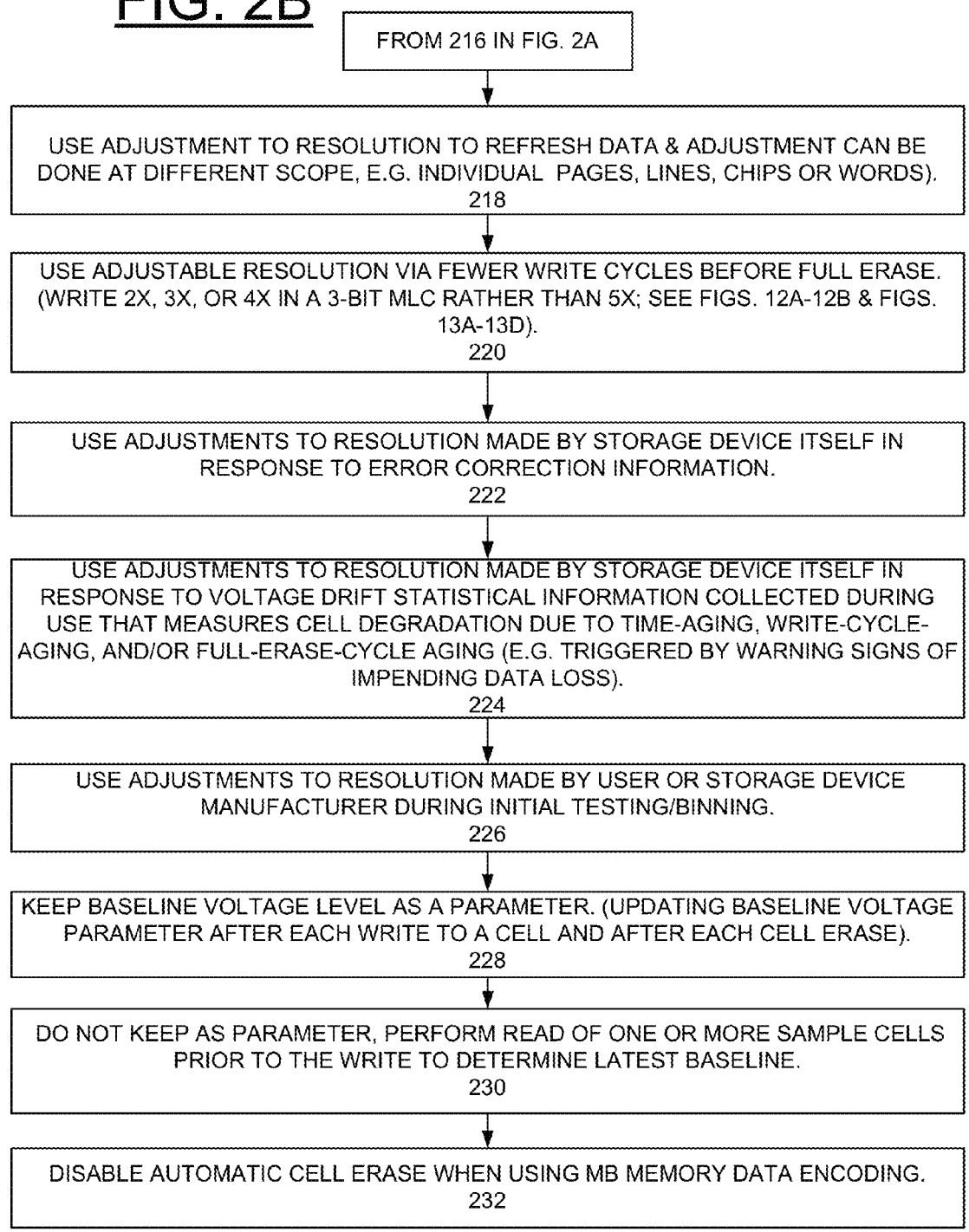

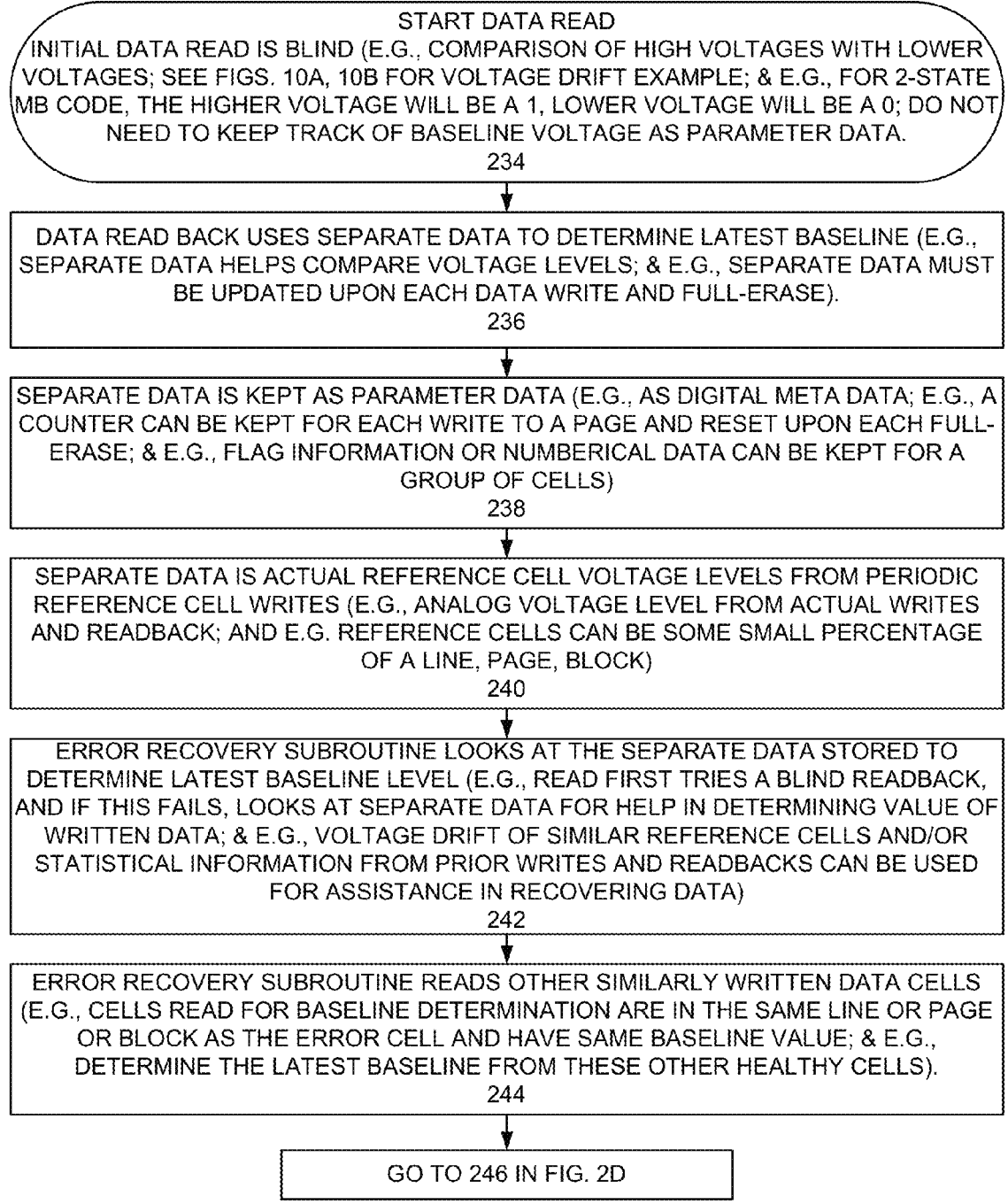

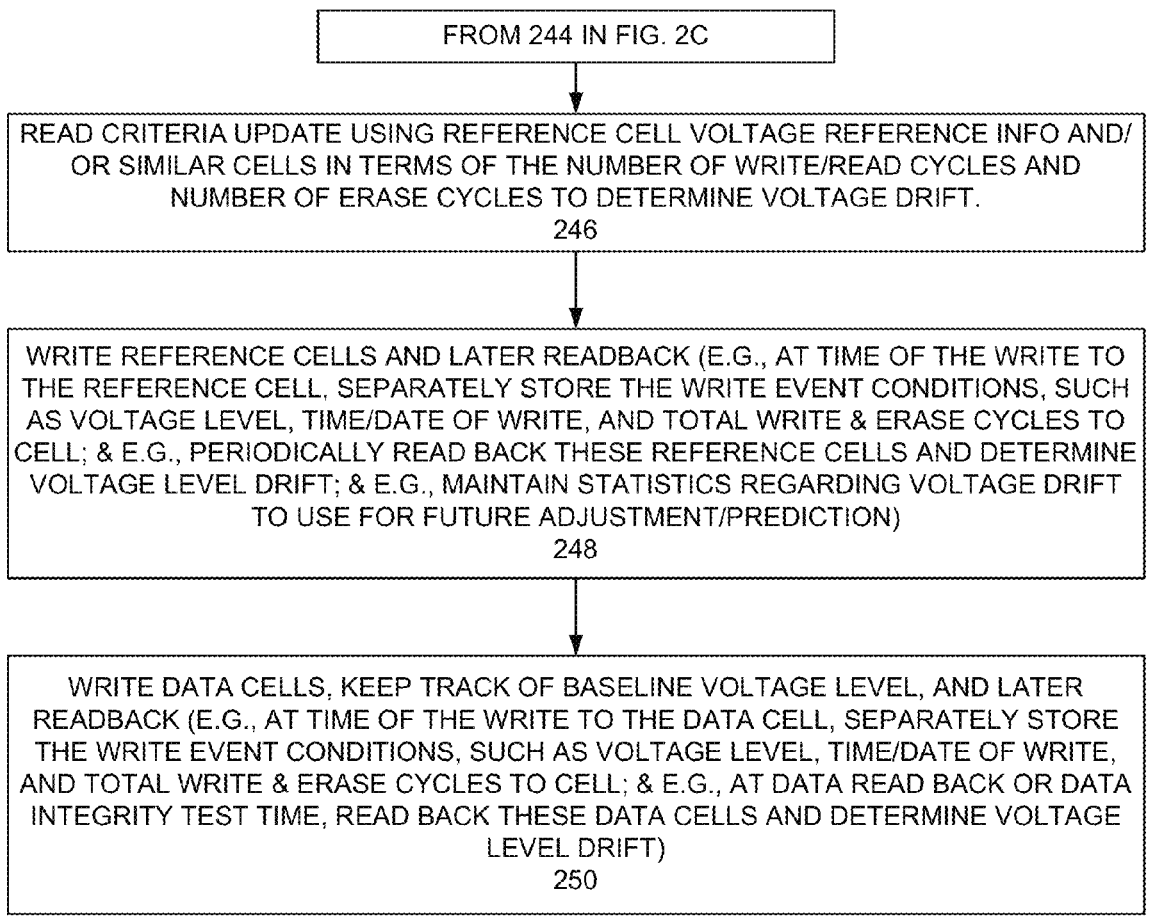

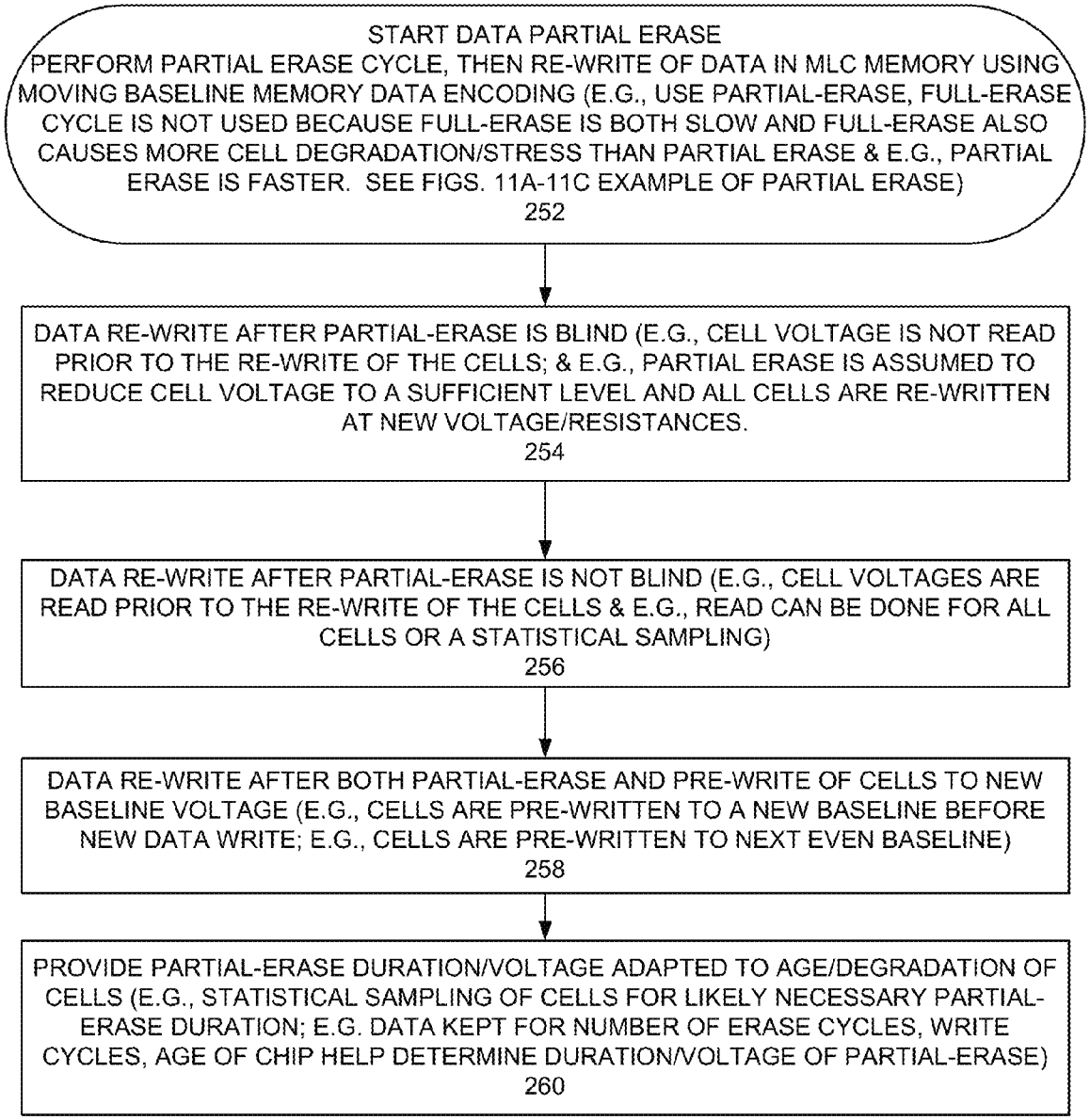

START STATE, ALL CELLS FULLY ERASED

300

| CELL 7 | CELL 6 | CELL 5 | CELL 4 | CELL 3 | CELL 2 | CELL 1 | CELL 0 | |
|---|---|---|---|---|---|---|---|---|
|  |  |  |  |  |  |  |  | VTH-3 |
|  |  |  |  |  |  |  |  | VTH-2 |
|  |  |  |  |  |  |  |  | VTH-1 |
|  |  |  |  |  |  |  |  | 0 VOLTS |

FIG. 3A

START STATE, ALL CELLS FULLY ERASED

310

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-7 |
| | | | | | | | | VTH-6 |
| | | | | | | | | VTH-5 |
| | | | | | | | | VTH-4 |
| | | | | | | | | VTH-3 |
| | | | | | | | | VTH-2 |
| | | | | | | | | VTH-1 |
| | | | | | | | | 0 VOLTS |

FIG. 3B

START STATE, ALL CELLS FULLY ERASED

320

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-15 |
| | | | | | | | | VTH-14 |
| | | | | | | | | VTH-13 |
| | | | | | | | | VTH-12 |
| | | | | | | | | VTH-11 |
| | | | | | | | | VTH-10 |
| | | | | | | | | VTH-9 |
| | | | | | | | | VTH-8 |
| | | | | | | | | VTH-7 |
| | | | | | | | | VTH-6 |
| | | | | | | | | VTH-5 |
| | | | | | | | | VTH-4 |
| | | | | | | | | VTH-3 |
| | | | | | | | | VTH-2 |
| | | | | | | | | VTH-1 |
| | | | | | | | | 0 VOLTS |

FIG. 3C

2-STATE MBW CYCLES

400

| CELL 7 | CELL 6 | CELL 5 | CELL 4 | CELL 3 | CELL 2 | CELL 1 | CELL 0 | |
|---|---|---|---|---|---|---|---|---|
| 3 | | | | | | | | VTH-3 |
| 2 | | | | | | | | VTH-2 |
| 1 | | | | | | | | VTH-1 |
| | | | | | | | | 0 VOLTS |

410

| CELL 7 | CELL 6 | CELL 5 | CELL 4 | CELL 3 | CELL 2 | CELL 1 | CELL 0 | |
|---|---|---|---|---|---|---|---|---|
| 7 | | | | | | | | VTH-7 |
| 6 | | | | | | | | VTH-6 |
| 5 | | | | | | | | VTH-5 |
| 4 | | | | | | | | VTH-4 |
| 3 | | | | | | | | VTH-3 |
| 2 | | | | | | | | VTH-2 |
| 1 | | | | | | | | VTH-1 |
| | | | | | | | | 0 VOLTS |

420

| CELL 7 | CELL 6 | CELL 5 | CELL 4 | CELL 3 | CELL 2 | CELL 1 | CELL 0 | |
|---|---|---|---|---|---|---|---|---|
| 15 | | | | | | | | VTH-15 |
| 14 | | | | | | | | VTH-14 |
| 13 | | | | | | | | VTH-13 |
| 12 | | | | | | | | VTH-12 |
| 11 | | | | | | | | VTH-11 |
| 10 | | | | | | | | VTH-10 |
| 9 | | | | | | | | VTH-9 |
| 8 | | | | | | | | VTH-8 |
| 7 | | | | | | | | VTH-7 |
| 6 | | | | | | | | VTH-6 |
| 5 | | | | | | | | VTH-5 |
| 4 | | | | | | | | VTH-4 |
| 3 | | | | | | | | VTH-3 |
| 2 | | | | | | | | VTH-2 |
| 1 | | | | | | | | VTH-1 |
| | | | | | | | | 0 VOLTS |

FIG. 4A

2- STATE, 2-BIT CELL EXAMPLE, START STATE

500

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-3 |
| | | | | | | | | VTH-2 |
| | | | | | | | | VTH-1 |
| | | | | | | | | 0 VOLTS |

FIG. 5A

2- STATE, 2-BIT CELL EXAMPLE, FIRST WRITE

510

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-3 |
| | | | | | | | | VTH-2 |
| 1 | 0 | 1 | 1 | 0 | 1 | 0 | 1 | VTH-1_THRESHOLD-1 |
| | | | | | | | | 0 VOLTS=BASELINE |

FIG. 5B

2- STATE, 2-BIT CELL EXAMPLE, SECOND WRITE

520

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-3 |
| 1 | 1 | 1 | 0 | 0 | 1 | 0 | 1 | VTH-2_THRESHOLD-1 |
| --CHARGES LEVELED-- | | | | | | | | VTH-1=BASELINE |
| | | | | | | | | 0 VOLTS |

FIG. 5C

2- STATE, 2-BIT CELL EXAMPLE, THIRD WRITE

530

| CELL 7 | CELL 6 | CELL 5 | CELL 4 | CELL 3 | CELL 2 | CELL 1 | CELL 0 | |
|---|---|---|---|---|---|---|---|---|
| 0 | 1 | 1 | 1 | 0 | 0 | 1 | 1 | VTH-3_THRESHOLD-1 |
| --CHARGES LEVELED-- | | | | | | | | VTH-2=BASELINE |
| | | | | | | | | VTH-1 |
| | | | | | | | | 0 VOLTS |

FIG. 5D

2- STATE, 3-BIT MLC CELL EXAMPLE, SEVENTH WRITE

620

| CELL 7 | CELL 6 | CELL 5 | CELL 4 | CELL 3 | CELL 2 | CELL 1 | CELL 0 | |
|---|---|---|---|---|---|---|---|---|
| 0 | 0 | 1 | 0 | 1 | 0 | 0 | 1 | VTH-7_THRESHOLD-1 |
| ---CHARGES LEVELED--- | | | | | | | | VTH-6=BASELINE |
| | | | | | | | | VTH-5 |
| | | | | | | | | VTH-4 |
| | | | | | | | | VTH-3 |
| | | | | | | | | VTH-2 |
| | | | | | | | | VTH-1 |
| | | | | | | | | 0 VOLTS |

FIG. 6C

3- STATE, 3-BIT MLC CELL EXAMPLE, FIRST WRITE

700

| CELL 7 | CELL 6 | CELL 5 | CELL 4 | CELL 3 | CELL 2 | CELL 1 | CELL 0 | |
|---|---|---|---|---|---|---|---|---|
|  |  |  |  |  |  |  |  | VTH-7 |
|  |  |  |  |  |  |  |  | VTH-6 |
|  |  |  |  |  |  |  |  | VTH-5 |
|  |  |  |  |  |  |  |  | VTH-4 |
|  |  |  |  |  |  |  |  | VTH-3 |
| 2 | 0 | 1 | 2 | 0 | 0 | 1 | 2 | VTH-2_THRESHOLD-2 |
|  |  |  |  |  |  |  | 1 | VTH-1_THRESHOLD-1 |
|  |  |  |  |  |  |  |  | 0 VOLTS=BASELINE |

FIG. 7A

3- STATE, 3-BIT MLC CELL EXAMPLE, SECOND WRITE

710

| CELL 7 | CELL 6 | CELL 5 | CELL 4 | CELL 3 | CELL 2 | CELL 1 | CELL 0 | |
|---|---|---|---|---|---|---|---|---|
|  |  |  |  |  |  |  |  | VTH-7 |
|  |  |  |  |  |  |  |  | VTH-6 |
|  |  |  |  |  |  |  |  | VTH-5 |
| 0 | 1 | 2 | 0 | 1 | 0 | 1 | 2 | VTH-4_THRESHOLD-2 |
|  |  |  |  |  |  |  |  | VTH-3_THRESHOLD-1 |
| --CHARGES LEVELED-- |  |  |  |  |  |  |  | VTH-2=BASELINE |
|  |  |  |  |  |  |  |  | VTH-1 |
|  |  |  |  |  |  |  |  | 0 VOLTS |

FIG. 7B

3- STATE, 3-BIT MLC CELL EXAMPLE, THIRD WRITE

| 720 | | | | | | | | |
|---|---|---|---|---|---|---|---|---|
| CELL 7 | CELL 6 | CELL 5 | CELL 4 | CELL 3 | CELL 2 | CELL 1 | CELL 0 | |
| | | | | | | | | VTH-7 |
| 2 | 0 | 2 | 0 | 1 | 2 | 0 | 0 | VTH-6_THRESHOLD-2 |
| | | | | | | | | VTH-5_THRESHOLD-1 |
| —CHARGES LEVELED— | | | | | | | | VTH-4=BASELINE |
| | | | | | | | | VTH-3 |
| | | | | | | | | VTH-2 |
| | | | | | | | | VTH-1 |
| | | | | | | | | 0 VOLTS |

FIG. 7C

3- STATE, 4-BIT MLC CELL EXAMPLE, FIRST WRITE

800

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-15 |
| | | | | | | | | VTH-14 |
| | | | | | | | | VTH-13 |
| | | | | | | | | VTH-12 |
| | | | | | | | | VTH-11 |
| | | | | | | | | VTH-10 |
| | | | | | | | | VTH-9 |
| | | | | | | | | VTH-8 |
| | | | | | | | | VTH-7 |
| | | | | | | | | VTH-6 |
| | | | | | | | | VTH-5 |
| | | | | | | | | VTH-4 |
| | | | | | | | | VTH-3 |
| 2 | 0 | 1 | 2 | 0 | 0 | 1 | 2 | VTH-2_THRESHOLD-2 |
| | | | | | | | | VTH-1_THRESHOLD-1 |
| | | | | | | | | 0 VOLTS=BASELINE |

FIG. 8A

3- STATE, 4-BIT MLC CELL EXAMPLE, SECOND WRITE

810

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-15 |
| | | | | | | | | VTH-14 |
| | | | | | | | | VTH-13 |
| | | | | | | | | VTH-12 |
| | | | | | | | | VTH-11 |
| | | | | | | | | VTH-10 |
| | | | | | | | | VTH-9 |
| | | | | | | | | VTH-8 |
| | | | | | | | | VTH-7 |
| | | | | | | | | VTH-6 |
| | | | | | | | | VTH-5 |
| 0 | 1 | 2 | 0 | 1 | 0 | 1 | 2 | VTH-4_THRESHOLD-2 |
| | | | | | | | | VTH-3_THRESHOLD-1 |
| --CHARGES LEVELED-- | | | | | | | | VTH-2=BASELINE |
| | | | | | | | | VTH-1 |
| | | | | | | | | 0 VOLTS |

FIG. 8B

3- STATE, 4-BIT MLC CELL EXAMPLE, SEVENTH WRITE

| 820 CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-15 |
| 2 | 0 | 2 | 0 | 1 | 2 | 0 | 0 | VTH-14_THREHOLD-2 |
| | | | | | | | | VTH-13_THRESHOLD-1 |
| --CHARGES LEVELED-- | | | | | | | | VTH-12=BASELINE |
| | | | | | | | | VTH-11 |
| | | | | | | | | VTH-10 |
| | | | | | | | | VTH-9 |
| | | | | | | | | VTH-8 |
| | | | | | | | | VTH-7 |
| | | | | | | | | VTH-6 |
| | | | | | | | | VTH-5 |
| | | | | | | | | VTH-4 |
| | | | | | | | | VTH-3 |
| | | | | | | | | VTH-2 |
| | | | | | | | | VTH-1 |
| | | | | | | | | 0 VOLTS |

FIG. 8C

4- STATE, 4-BIT MLC CELL EXAMPLE, FIRST WRITE

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-15 |
| | | | | | | | | VTH-14 |
| | | | | | | | | VTH-13 |
| | | | | | | | | VTH-12 |
| | | | | | | | | VTH-11 |
| | | | | | | | | VTH-10 |
| | | | | | | | | VTH-9 |
| | | | | | | | | VTH-8 |
| | | | | | | | | VTH-7 |
| | | | | | | | | VTH-6 |
| | | | | | | | | VTH-5 |
| | | | | | | | | VTH-4 |
| 3 | 1 | 2 | 3 | 0 | 1 | 2 | 3 | VTH-3_THRESHOLD-3 |
| | | | | | | | | VTH-2_THRESHOLD-2 |
| | | | | | | | | VTH-1_THRESHOLD-1 |
| | | | | | | | | 0 VOLTS=BASELINE |

4- STATE, 4-BIT MLC CELL EXAMPLE, FIFTH WRITE

910

| CELL 7 | CELL 6 | CELL 5 | CELL 4 | CELL 3 | CELL 2 | CELL 1 | CELL 0 | VTH-15 |
|---|---|---|---|---|---|---|---|---|
| 1 | 2 | 2 | 0 | 3 | 2 | 0 | 3 | VTH-14_THRESHOLD-3 |
|   |   |   |   |   |   |   |   | VTH-13_THRESHOLD-2 |
|   |   |   |   |   |   |   |   | VTH-12_THRESHOLD-1 |
| —CHARGES LEVELED— |   |   |   |   |   |   |   | VTH-11=BASELINE |
|   |   |   |   |   |   |   |   | VTH-10 |
|   |   |   |   |   |   |   |   | VTH-9 |
|   |   |   |   |   |   |   |   | VTH-8 |
|   |   |   |   |   |   |   |   | VTH-7 |
|   |   |   |   |   |   |   |   | VTH-6 |
|   |   |   |   |   |   |   |   | VTH-5 |
|   |   |   |   |   |   |   |   | VTH-4 |
|   |   |   |   |   |   |   |   | VTH-3 |
|   |   |   |   |   |   |   |   | VTH-2 |
|   |   |   |   |   |   |   |   | VTH-1 |
|   |   |   |   |   |   |   |   | 0 VOLTS |

FIG. 9B

VOLTAGE DRIFT 2-BIT MLC NAND CELL EXAMPLE, DATA WRITTEN

1000

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-5 |
| 0 | 1 | 1 | 1 | 0 | 0 | 1 | 1 | VTH-4_THRESHOLD |
| | | | | | | | 1 | VTH-3=BASELINE |
| | | | | | | | | VTH-2 |
| | | | | | | | | VTH-1 |
| | | | | | | | | 0 VOLTS |

FIG. 10A

VOLTAGE DRIFT 2-BIT MLC NAND CELL EXAMPLE, DATA READ

1010

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-3 |
| | | | | | | | | VTH-2 |
| 0 | 1 | 1 | 1 | 0 | 0 | 1 | 1 | VTH-2'_THRESHOLD |
| | | | | | | | | VTH-1 |
| | | | | | | | | VTH-1'_BASELINE |
| | | | | | | | | 0 VOLTS |

FIG. 10B

PARTIAL ERASE 2-BIT MLC NAND CELL EXAMPLE, THIRD DATA WRITE

1100

| CELL 7 | CELL 6 | CELL 5 | CELL 4 | CELL 3 | CELL 2 | CELL 1 | CELL 0 | |
|---|---|---|---|---|---|---|---|---|
| 0 | 1 | 1 | 1 | 0 | 0 | 1 | 1 | VTH-3_THRESHOLD |
| | | | | | | | | VTH-2=BASELINE |
| | | | | | | | | VTH-1 |
| | | | | | | | | 0 VOLTS |

FIG. 11A

PARTIAL ERASE 2-BIT MLC NAND CELL EXAMPLE, FAST PARTIAL ERASE

1110

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-3 |
| | | | | | | | | VTH-2=BASELINE |
| | | | | | | | | VTH-1 |
| | | | | | | | | 0 VOLTS |

FIG. 11B

PARTIAL ERASE 2-BIT MLC NAND CELL EXAMPLE, DATA RE-WRITE

1120

| CELL 7 | CELL 6 | CELL 5 | CELL 4 | CELL 3 | CELL 2 | CELL 1 | CELL 0 | |
|---|---|---|---|---|---|---|---|---|
| 0 | 1 | 0 | 1 | 1 | 0 | 0 | 1 | VTH-3_THRESHOLD |
| --CHARGES LEVELED-- | | | | | | | | VTH-2=BASELINE |
| | | | | | | | | VTH-1 |
| | | | | | | | | 0 VOLTS |

FIG. 11C

CHANGE TO THRESHOLD RESOLUTION 2-BIT MLC NAND CELL
EXAMPLE, UN-DEGRADED CELL
1200

| CELL 7 | CELL 6 | CELL 5 | CELL 4 | CELL 3 | CELL 2 | CELL 1 | CELL 0 | |
|---|---|---|---|---|---|---|---|---|
|  |  |  |  |  |  |  |  | VTH-3 |
|  |  |  |  |  |  |  |  | VTH-2 |
|  |  |  |  |  |  |  |  | VTH-1 |
|  |  |  |  |  |  |  |  | 0 VOLTS |

FIG. 12A

CHANGE TO THRESHOLD RESOLUTION 2-BIT MLC NAND CELL
EXAMPLE, DEGRADED CELL
1210

| CELL 7 | CELL 6 | CELL 5 | CELL 4 | CELL 3 | CELL 2 | CELL 1 | CELL 0 | |
|---|---|---|---|---|---|---|---|---|
|  |  |  |  |  |  |  |  | VTH-2' |
|  |  |  |  |  |  |  |  | VTH-1' |
|  |  |  |  |  |  |  |  | 0 VOLTS |

FIG. 12B

CHANGE TO THRESHOLD RESOLUTION 3-BIT MLC NAND CELL
EXAMPLE, UN-DEGRADED CELL

1300

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-5 |
| | | | | | | | | VTH-4 |
| | | | | | | | | VTH-3 |
| | | | | | | | | VTH-2 |
| | | | | | | | | VTH-1 |
| | | | | | | | | 0 VOLTS |

FIG. 13A

CHANGE TO THRESHOLD RESOLUTION 3-BIT MLC NAND CELL
EXAMPLE, DEGRADED CELL

1310

| CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-4' |
| | | | | | | | | VTH-3' |
| | | | | | | | | VTH-2' |
| | | | | | | | | VTH-1' |
| | | | | | | | | 0 VOLTS |

FIG. 13B

CHANGE TO THRESHOLD RESOLUTION 3-BIT MLC NAND CELL
EXAMPLE, DEGRADED CELL

| 1320 CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-3' |
| | | | | | | | | VTH-2' |
| | | | | | | | | VTH-1' |
| | | | | | | | | 0 VOLTS |

FIG. 13C

CHANGE TO THRESHOLD RESOLUTION 3-BIT MLC NAND CELL
EXAMPLE, DEGRADED CELL

| 1330 CELL 7 | CELL 6 | CELL 5 | CELL 4 | CELL 3 | CELL 2 | CELL 1 | CELL 0 | |
|---|---|---|---|---|---|---|---|---|
| | | | | | | | | VTH-2' |
| | | | | | | | | VTH-1' |
| | | | | | | | | 0 VOLTS |

| LEVELS PER CELL 1402 | NUMERICAL BASE 1404 | NUMBER OF Vth'S 1406 | AVAILABLE MOVING BASELINE WRITES IF CELLS ARE UN-DEGRADED (AFTER FULL ERASE) 1408 | AVAILABLE RANGE OF MOVING BASELINE WRITES IF CELLS ARE DEGRADED (AFTER FULL ERASE) 1410 |
|---|---|---|---|---|
| 2 | 1-BIT BINARY | 1 | N/A | N/A |
| 3 | BASE-3 | 2 | 2 | N/A |
| 4 | 2-BIT BINARY | 3 | 3 | 2 |
| 5 | BASE-5 | 4 | 4 | 2 TO 3 |
| 6 | BASE-6 | 5 | 5 | 2 TO 4 |
| 7 | BASE-7 | 6 | 6 | 2 TO 5 |
| 8 | 3-BIT BINARY | 7 | 7 | 2 TO 6 |
| 9 | BASE-9 | 8 | 8 | 2 TO 7 |
| 10 | BASE-10 | 9 | 9 | 2 TO 8 |
| 11 | BASE-11 | 10 | 10 | 2 TO 9 |
| 12 | BASE-12 | 11 | 11 | 2 TO 10 |
| 13 | BASE-13 | 12 | 12 | 2 TO 11 |
| 14 | BASE-14 | 13 | 13 | 2 TO 12 |
| 15 | BASE-15 | 14 | 14 | 2 TO 13 |
| 16 | 4-BIT BINARY | 15 | 15 | 2 TO 14 |

FIG. 14

VOLTAGE LEAK INDICATION
2-BIT MLC NAND CELL EXAMPLE, DATA WRITTEN

1500

| CELL 7 | CELL 6 | CELL 5 | CELL 4 | CELL 3 | CELL 2 | CELL 1 | CELL 0 | |
|---|---|---|---|---|---|---|---|---|
| 0 | 1 | 1 | 1 | 0 | 0 | 1 | 1 | VTH-3_THRESHOLD-1 |
|   |   |   |   |   |   |   |   | VTH-2=BASELINE |
|   |   |   |   |   |   |   |   | VTH-1 |
|   |   |   |   |   |   |   |   | 0 VOLTS |

FIG. 15A

VOLTAGE LEAK INDICATION
2-BIT MLC NAND CELL EXAMPLE, DATA READ BACK

1510

| CELL 7 | CELL 6 | CELL 5 | CELL 4 | CELL 3 | CELL 2 | CELL 1 | CELL 0 | |
|---|---|---|---|---|---|---|---|---|
| 0 | 1 | 1 | 1 | ? | 0 | 1 | 1 | VTH-3_THRESHOLD-1 |
|   |   |   |   | ? |   |   |   | VTH-2=BASELINE |
|   |   |   |   |   |   |   |   | VTH-1 |
|   |   |   |   |   |   |   |   | 0 VOLTS |

FIG. 15B

IMPLEMENTING ENHANCED DATA PARTIAL-ERASE FOR MULTI-LEVEL CELL (MLC) MEMORY USING THRESHOLD VOLTAGE-DRIFT OR RESISTANCE DRIFT TOLERANT MOVING BASELINE MEMORY DATA ENCODING

RELATED APPLICATIONS

Related applications by the present inventors and present assignee are being filed on the same day herewith including: Ser. No. 13/361,905, entitled "IMPLEMENTING ENHANCED DATA WRITE FOR MULTI-LEVEL CELL (MLC) MEMORY USING THRESHOLD VOLTAGE-DRIFT OR RESISTANCE DRIFT TOLERANT MOVING BASELINE MEMORY DATA ENCODING"; and Ser. No. 13/361,918, entitled "IMPLEMENTING ENHANCED DATA READ FOR MULTI-LEVEL CELL (MLC) MEMORY USING THRESHOLD VOLTAGE-DRIFT OR RESISTANCE DRIFT TOLERANT MOVING BASELINE MEMORY DATA ENCODING".

FIELD OF THE INVENTION

The present invention relates generally to the data storage field, and more particularly, relates to a method and apparatus for implementing enhanced performance including enhanced data write, enhanced data read, and enhanced data partial-erase for multi-level cell (MLC) memory using threshold-voltage-drift or resistance-drift tolerant moving baseline memory data encoding in the interest of extending endurance of non-volatile memories by diminishing damage while performing those enhanced operations.

DESCRIPTION OF THE RELATED ART

As used in the following description and claims, the following terms should be understood as follows:

Multi-level cell (MLC) memory should be broadly understood to include both NAND flash memory and phase-change-memory (PCM).

Threshold voltage drift in NAND flash results from loss of charges in floating gate thus affecting a decrease total charge and resistance drift in PCM results from changes to the memory element's resistance where resistance generally increases over time due to structural relaxation of the amorphous phase, hence the drift. It is also possible that the amorphous state changes to the more stable and lower resistance crystalline state but that would be a catastrophic and fast phenomenon, which would fully erase the cell. Voltage or resistance drift should therefore be broadly understood to include a change over time from an original write time not necessarily a drift down or drift upward.

Threshold-voltage-drift or resistance-drift tolerant moving baseline (MB) memory data encoding should be broadly understood to include a selected one of various multiple state level data in a self-referenced method that allows content of each memory cell to be determined in relation to the content of neighboring memory cells.

A need exists to provide an effective, and efficient mechanism for implementing MLC memory data write, data read and data partial-erase, for example, for solid state drives (SSDs)), in the interest diminishing damage or ageing incurred by the memory cells per write or erase operation.

SUMMARY OF THE INVENTION

Aspects of the present invention are to provide a method and apparatus for implementing enhanced performance for multi-level cell (MLC) memory, for example, for solid state drives (SSDs). Other important aspects of the present invention are to provide such method and apparatus substantially without negative effect and that overcome some of the disadvantages of prior art arrangements.

In brief, a method and apparatus are provided for implementing enhanced performance for multi-level cell (MLC) memory using threshold-voltage-drift or resistance-drift tolerant moving baseline memory data encoding. A data partial erase for data written to the MLC memory using threshold-voltage-drift or resistance-drift tolerant moving baseline memory data encoding is performed, and a data re-write after the partial erase to the MLC memory is performed using threshold-voltage-drift or resistance-drift tolerant moving baseline memory data encoding. A data partial erase cycle includes a duration and voltage level based upon a degradation of the MLC memory cells.

BRIEF DESCRIPTION OF THE DRAWINGS

The present invention together with the above and other objects and advantages may best be understood from the following detailed description of the preferred embodiments of the invention illustrated in the drawings, wherein:

FIGS. 2A and 2B, 2C and 2D, and 2E are respective flow charts illustrating example operations of the system of FIG. 1 for implementing enhanced performance including enhanced data write, enhanced data read, and enhanced data partial-erase for multi-level cell (MLC) memory using threshold-voltage-drift or resistance-drift tolerant moving baseline memory data encoding, for example, for solid state drives (SSDs) in accordance with embodiments of the invention;

FIGS. 3A, 3B, and 3C respectively illustrate a start state with all cells fully erased for 2-bit NAND cells, 3-bit NAND cells and 4-bit NAND cells in accordance with embodiments of the invention;

FIG. 4A respectively illustrates 2-state moving baseline write (MBW) cycles for 2-bit NAND cells, 3-bit NAND cells and 4-bit NAND cells in accordance with embodiments of the invention;

FIGS. 5A, 5B, 5C, and 5D respectively illustrate example moving baseline coding operations of start with all cells fully erased, first write, second write, and third write for a 2-state, 2-bit MLC cell example in accordance with embodiments of the invention;

FIGS. 6A, 6B, and 6C respectively illustrate example moving baseline coding operations of first write, second write and seventh write for a 2-state, 3-bit MLC cell example in accordance with embodiments of the invention;

FIGS. 7A, 7B, and 7C respectively illustrate example moving baseline coding operations of first write, second write and third write for a 3-state, 3-bit MLC cell example in accordance with embodiments of the invention;

FIGS. 8A, 8B, and 8C respectively illustrate example moving baseline coding operations of first write, second write and seventh write for a 3-state, 4-bit MLC cell example in accordance with embodiments of the invention;

FIGS. 9A, and 9B respectively illustrate an example moving baseline coding operations of first write, and fifth write for a 4-state, 4-bit MLC cell example in accordance with embodiments of the invention;

FIGS. 10A, and 10B respectively illustrate an example voltage drift with operations of data written, and data read for a 2-bit MLC NAND cell example in accordance with embodiments of the invention;

FIGS. 11A, 11B, and 11C respectively illustrate an example partial-erase with operations of third data write, fast partial erase, and data re-write for a 2-bit MLC NAND cell example in accordance with embodiments of the invention;

FIGS. 12A, and 12B respectively illustrate an example change to threshold resolution with un-degraded cell and degraded cell for a 2-bit MLC NAND cell example in accordance with embodiments of the invention;

FIGS. 13A, and 13B, 13C, and 13D respectively illustrate example change to threshold resolution with un-degraded cell and degraded cell for a 3-bit MLC NAND cell example in accordance with embodiments of the invention;

FIG. 14 is a chart illustrating example parameter data for MLC cell examples in accordance with embodiments of the invention;

FIGS. 15A, and 15B illustrate example voltage leak indication with operations of data written, and data read for a 2-bit MLC NAND cell example in accordance with embodiments of the invention.

DETAILED DESCRIPTION OF THE PREFERRED EMBODIMENTS

Figure 1:
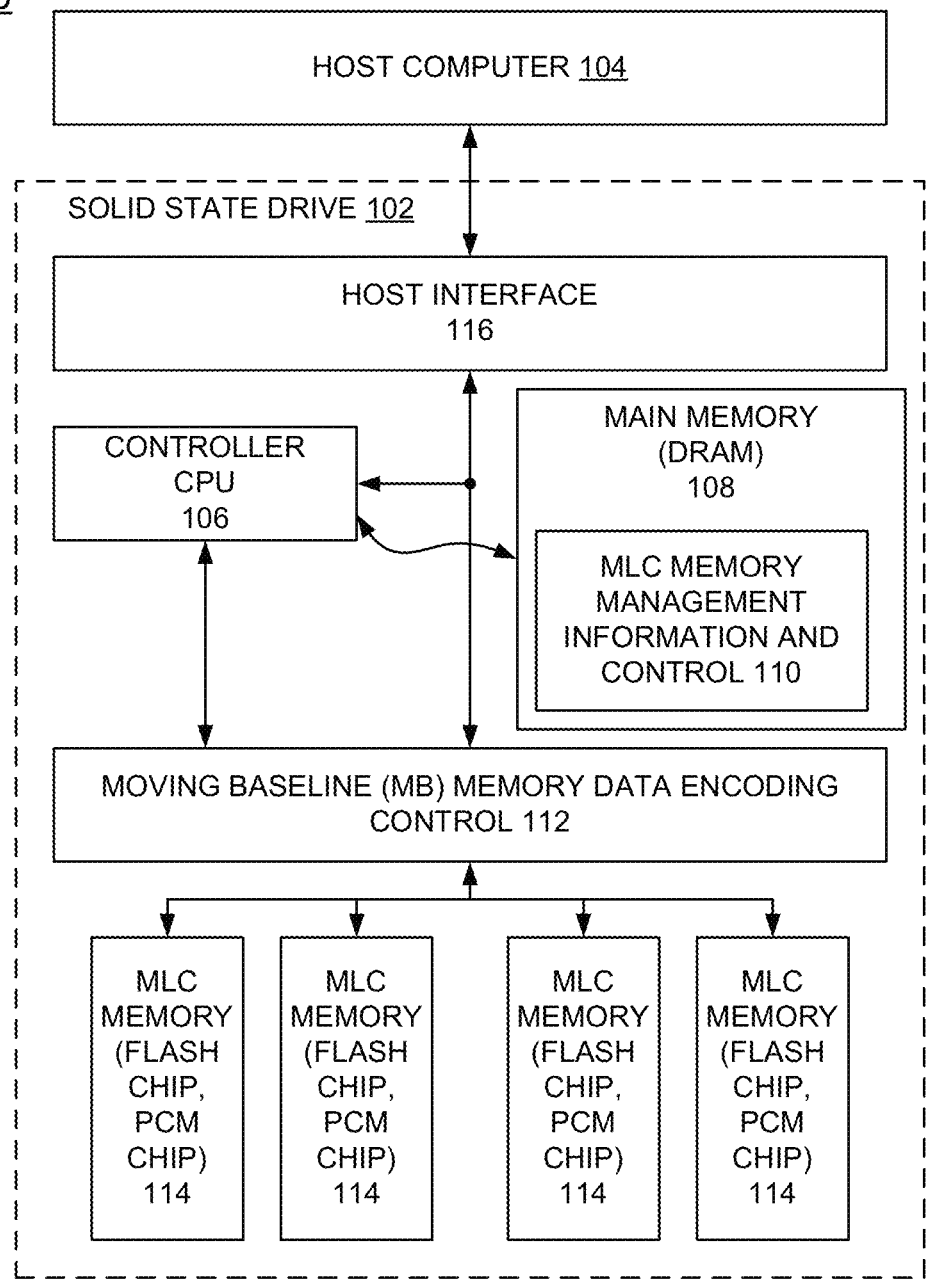
FIG. 1 is a block diagram representation illustrating a system for implementing enhanced performance methods for multi-level cell (MLC) memory using threshold-voltage-drift or resistance-drift tolerant moving baseline memory data encoding for solid state drives (SSDs) in accordance with an embodiment of the invention.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

In accordance with features of the invention, a method and apparatus are provided for implementing enhanced performance including enhanced data write, data read, and data partial-erase for multi-level cell (MLC) memory, for example, for solid state drives (SSDs). The enhanced data write, data read, and data partial-erase for MLC memory are implemented using threshold-voltage-drift or resistance-drift tolerant moving baseline (MB) memory data encoding of the invention.

In accordance with features of the invention, a moving baseline or floor is used in comparison to which read voltages are compared so that data integrity is less susceptible to threshold-voltage drift or resistance drift. Multi-level cell (MLC) phase change memory (PCM) and MLC NAND flash memory both have significant resistance drift and threshold-voltage drift respectively over time which is aggravated by typical write and erase cycles. Threshold voltage drift for cells of nearly identical charges physically located in proximity in the MLC NAND chip is nearly congruent, while this is not the case for cells of extremely different voltages physically placed away from each other in the chip. The large charge difference occurs when full MLC bit writing capability is employed during data cell writes. Similarly, the resistance value drift for cells of nearly identical degree of amorphous/crystalline state physically placed in close proximity in the MLC PCM chip is nearly congruent, while this is not expected to be the case for cells with extremely different amorphous/crystalline states physically placed far away from each other in the chip. The large difference in amorphous/crystalline state occurs when the full MLC bit writing capability is employed during data cell writes. With threshold voltage or resistance drift between similar-state memory cells in close physical proximity in the chip being generally congruent data can be more accurately recovered even with an occasional significant drift of a memory cell using voltage-drift or resistance drift tolerant MB data encoding of the invention.

In accordance with features of the invention, fewer full-erases of cells are provided, enabling a longer lifetime for the storage device. Full erase of cells causes significant degradation to cell; about 5 k maximum full erase/write cycles are typical in 25 nm MLC NAND flash memory. Conventional higher voltages and longer time duration of voltage event during the full erase cause sustained high electric fields near floating gates of NAND cells with more damage. The present invention uses smaller charge transfers to re-write new data upon old data; minimizing change to charge content of the floating gate. The postponed erase operation comes after several consecutive write operations (and not after each write operation), and when it comes a partial erase instead of a full erase is used.

Erase cycles of phase change memory (PCM) are slow, and require heating of the storage element then a slow cooling of the element. For example, there is a benefit time for writing faster without any initial full erase. If alternatively, the PCM cells are placed in their highest resistance (amorphous state) for instance, the resistance of those PCM cells can be decreased by additional current pulse or pulses to the cells, nudging them progressively towards the more stable and low resistance crystalline state. Thus MLC PCM cell resistance can be changed without a full erase by pulsing the cell with voltage/current. Similarly, charge content in the floating gate of MLC NAND cells can be increased without a full erase.

The Moving Baseline (MB) memory data encoding of the invention is now described using illustrative MLC NAND Flash cases. It should be understood that one skilled in the art will recognize that MB memory data encoding of the invention advantageously is extended to multi-level PCM memory without departing from the spirit or scope of the invention.

In accordance with features of the invention, an overall increase in number of byte-writes to the storage devices is enabled. For example, a 3-bit MLC storage cell can be written at least seven times before a full-erase using 2-state MB code, increasing lifetime of cell about seven times, the loss of full data capacity for each write to a cell is only one third or one bit rather than three bits, thus there is an overall increase in lifetime of the storage device as measured in a per-written-byte basis. The 2-state MB coding produces a 1-bit number in each cell regardless of the number of write levels, such that 3, 4, 5, 6, 7, 8, 9, or 10 write-levels all produce a 1-bit number.

A 4-bit MLC storage cell can be written at least fifteen times before a full-erase using 2-state MB code, increasing lifetime of cell about fifteen times, the loss of full data capacity for each write to a cell is only one fourth or one bit rather than four bits, thus there is an overall increase in lifetime of the storage device as measured in a per-written-byte basis. In fact, the larger the number of levels, the larger the benefit in lifetime measured in per-written-byte basis MB can accrue. Note that these calculations are approximate as there is stress during the write cycle; however, this stress is significantly lower than the effects of full-erase stresses. Moreover, some writes may not need to move the baseline upwards so that a larger number of writes than threshold voltage levels in the MLC cell can be accommodated.

In accordance with features of the invention, with MB data encoding, floating gate charges between adjacent NAND flash cells are in a similar range for example, as increasingly becomes favored by shrinking memory cell dimensions. Continuous shrinking of NAND memory sizes enhances the capacitance coupling between adjacent cells, significantly increasing the lateral fringing field disturbing NAND operations. For example, simulations show that threshold voltage shift ($\Delta VT$) induced by adjacent cells on the same bitline (BL) and wordline (WL) increases exponentially with technology scaling.

In accordance with features of the invention, overhead needed for MB data encoding is minimal. Illegal data combinations for a group of memory cells are unlikely events that can be flagged as they occur in parameter data areas. Since MB is self referenced, if all the cells have the same threshold voltage, it can both be that all cells are 0s or all cells are 1s. This case can be avoided or flagged with the flag stored in a specified bit. Because MB data encoding keeps sets of memory cells self referenced with all these cells being allowed to have only one of two possible threshold values, if a few of the cells drift away from the set, it is possible to correct their contents. This could reduce the number of bytes of ECC protection that is needed to protect data.

Having reference now to the drawings, in FIG. 1, there is shown an example system for implementing enhanced data write, data read, and data partial-erase methods for multi-level cell (MLC) memory, for example, for solid state drives (SSDs) generally designated by the reference character 100 in accordance with an embodiment of the invention. System 100 includes a solid state drive 102 and a host computer 104. SSD 102 includes a controller 106 coupled to a main memory or dynamic random access memory (DRAM) 108, an MLC memory management information and control 110 and a moving baseline (MB) memory data encoding control 112.

SSD 102 includes a plurality of multi-level cell (MLC) memory devices 114 coupled to the moving baseline (MB) memory data encoding control block 112 coupled to the controller 106, such as a NAND flash chips 114 or phase-change-memory (PCM) chips 114, or a combination of NAND flash chips and PCM chips. SSD 102 includes a host interface 116 coupled between the host computer 104, and the controller 106 and the moving baseline (MB) memory data encoding control block 112.

Although the example embodiment of system 100 is described in the context of the solid state drive 102, it should be understood that principles of the present invention advantageously are applied to other types of data storage devices.

System 100 is shown in simplified form sufficient for understanding the present invention. For example, the controller 106 can be fabricated on one or multiple integrated circuit dies, and is suitably programmed to implement methods in accordance with embodiments of the invention.

SSD 102 implements enhanced data write, data read, and data partial-erase for multi-level cell (MLC) memory using threshold-voltage-drift or resistance-drift tolerant moving baseline memory data encoding for robust MLC memory data write, for robust MLC memory data read, and for robust MLC memory data partial-erase in accordance with embodiments of the invention. The controller 106 of SSD 102 includes firmware that is given direct access to moving baseline (MB) memory data encoding control block 112. The firmware of controller 106 of SSD 102 is given information with respect to the moving baseline (MB) memory data encoding control block 112, for example, from the MLC memory management information and control block 110.

It should be understood that principles of the present invention are not limited to the illustrated system 100 and SSD 102. For example, the MLC memory management information and control block 110 and MB memory data encoding control block 112 could be implemented by the host computer 104 or within the MLC memory devices 114, instead of the MB memory data encoding being performed by the SSD 102.

Referring now to FIGS. 2A and 2B, 2C and 2D, and 2E, there are shown respective flow charts illustrating example operations of the system of FIG. 1 for implementing enhanced performance including enhanced data write, enhanced data read, and enhanced data partial-erase for multi-level cell (MLC) memory using threshold-voltage-drift or resistance-drift tolerant moving baseline memory data encoding, for example, for solid state drives (SSDs) in accordance with embodiments of the invention.

In accordance with features of the invention, voltage-drift tolerant moving baseline memory data encoding for robust MLC memory data write uses a moving baseline, which is a floor or minimum voltage level for each new write to a memory cell. The multi-level cell memory optionally includes PCM and NAND flash memory. There is a need to know the baseline of prior write before a data write, this information can be determined by reading the cells before the write, or keeping parameter information on cells with last known baseline level, where a group of memory cells may have the same baseline.

In accordance with features of the invention, for example, at least two or more write cycles are enabled before full-erase, with using half or less of the full MLC bit range. Illegal data combinations for a group of memory cells are avoided by coding or separate flags are used, such as all 0s are not permitted, or all 1s are not permitted; or a flag is set to indicate whether a set of cells with the same threshold voltage or same resistance value represents all 0s or all 1s data.

FIGS. 2A and 2B, 2C and 2D, and 2E provide respective flow charts illustrating example operations of the system 100 for implementing enhanced performance including enhanced data write, enhanced data read, and enhanced data partial-erase for multi-level cell (MLC) memory using moving baseline memory data encoding, for example, for solid state drives (SSDs) in accordance with embodiments of the invention. In FIGS. 2A and 2B, 2C and 2D, and 2E, it should be understood that the illustrated example operations or steps include some sequential operations or steps and also include optional operations or steps, alternative operations or steps and combined operations or steps of optional embodiments of the invention.

Referring now to FIGS. 2A and 2B, example operations start for robust MLC memory data write as indicated at a block 200. The moving baseline is a new floor or minimum voltage level for each new write to a memory cell. The baseline for the prior write is obtained prior to the write, for example, by reading cells before the write, or by keeping parameter information of cells with last known baseline level.

The robust MLC memory data write optionally uses substitution code to avoid illegal data combinations. For example, a run-length-limited (RLL) code is used as substitution code as indicated at a block 202. Separate flags are used to indicate occurrences of illegal combinations, for example, a list of each occurrence of flags are stored in separate data area as indicated at a block 204. Separate flags at block 204 optionally are used together with the substitution code at block 202, or can be used as an alternative to the substitution code. Periodically reference cells optionally are written at specified voltage levels to keep track of baseline voltage and voltage levels of available data values in the group of cells, for example, for voltage levels equivalent to a 1 or 0 as indicated at a block 206.

As indicated at a block 208, for a 2-state MB-code of an optional embodiment, available data values for each cell are either a 1 or a 0. For example, see FIGS. 5A-5D and FIGS.

6A-6C. Cells act like single-level cell (SLC) with base-2 binary bit data. As indicated at a block 210, for a 3-state MB-code, available data values for each cell include, for example, a 2, or a 1 or a 0 in an optional embodiment. For example, see FIGS. 7A-7C and FIGS. 8A-8C. Cells data is base-3, with separate data coding to convert block of cells to base 2 binary data. As indicated at a block 212, for a 4-state MB-code, available data values for each cell include, for example, a 3, or a 2, or a 1 or a 0 in an optional embodiment. For example, see FIGS. 9A-9B. Cells data is again binary with 2-bits per cell.

As indicated at a block 214, adjustable bit resolution optionally is used, such as via downgrading state-level of MB-code. For example, write data in 3-state MB-code rather than 4-state MB-code, or as indicated at a block 216 write data in 3-state MB-code rather than 3-state or 4-state MB-code.

Referring to FIG. 2B, at block 218, note that using optional adjustment to resolution to refresh data and that adjustment can be done at different scope, for example, individual pages, individual lines, individual chips, or individual words. As indicated at a block 220, using optional adjustable resolution can be provided via fewer write cycles before full erase.

At block 222, adjustments to resolution can be made by storage device itself in response to error correction information in an optional embodiment. As indicated at a block 224, adjustments to resolution can be made by storage device itself in response to voltage drift statistical information collected by storage device during use that measures the degradation of cells due to time-aging, write-cycle-aging, and/or full-erase-cycle aging, for example, warning signs of impending data loss trigger the storage device to downgrade the resolution. As indicated at a block 226, adjustment or selection of resolution also or alternatively can be made by user, such as based upon needs of host computer or other associated device or changing equipments costs or data storage needs, or adjustment or selection of resolution also can be made by manufacturer of the storage device during initial testing or binning. For example, binning of chips or sub-blocks in chips are completed by adjustment and selection of resolution, such as downgrade state-level of MB-code or reduce number of write cycles before full erase.

As indicated at a block 228, the baseline voltage optionally can be kept as a parameter, for example, to know which new voltage to write to for each write without having to perform a data read prior to write and must update baseline voltage parameter after each write to a cell and after each cell erase. As indicated at a block 230 otherwise, the baseline voltage optionally is not kept as a parameter, for example, with performing a data read of one or more sample cells prior to write to determine latest baseline voltage in an optional embodiment.

At block 232, note that automatic cell erase must be disabled when using MB memory data encoding; a main benefit of MB memory data encoding is the avoidance of such full-erase cycles. Cells optionally are pre-written to new baseline prior to new data write.

In accordance with features of the invention, threshold-voltage-drift or resistance-drift tolerant moving baseline memory data encoding for robust MLC memory data read, enables read back and error recovery escalation for reading of data written to MLC with moving baseline.

Referring now to FIGS. 2C and 2D, operations start for robust MLC memory data read as indicated at a block 234. Initial data read optionally is blind, for example, using comparison of high voltages with lower voltages. See FIGS. 10A and 10B for voltage drift example. For example, for 2-state MB code, the higher voltage will be a 1 and lower voltage will be a 0, and keeping track of baseline voltage as parameter data is not needed.

As indicated at a block 236, data read back optionally uses separate data to determine latest baseline, for example, separate data helps to compare voltage levels; and for example, separate data must be updated upon each data write and full-erase. As indicated at a block 238, optionally separate data is kept as parameter data, for example, a counter can be kept for each write to a page and reset upon each full-erase. For example, flag information or numerical data can be kept for a group of cells. As indicated at a block 240, alternatively separate data is actual reference cell voltage levels from periodic reference cell writes, such as analog voltage level from actual writes and readback. Reference cells can be some small percentage of a line, page or block.

As indicated at a block 242, the error recovery subroutine optionally looks at the separate data stored to determine latest baseline level. For example, read first tries a blind readback and if this fails, then looking at separate is providing for help in determining value of written data. Voltage drift of similar reference cells and/or statistical information from prior writes and readbacks can be used for assistance in recovering data.

At block 244, the error recovery subroutine also or alternatively can read other similarly written data cells. For example, cells read for baseline determination are in the same line or page or block as the cell with error and have same baseline value. The baseline value is determined from these other healthy cells.

Referring to FIG. 2D, as indicated at a block 246 optionally read data update is provided using reference cell voltage reference information and/or similar cells in terms of the number of write/read cycles and number of erase cycles to determine voltage drift. As indicated at a block 248, for example, write reference cells and later readback. At a time of the write to the reference cell, separately store the write event conditions, such as voltage level, time/date of write, and total write and erase cycles to cell. For example, periodically read back these reference cells and determine voltage level drift; and maintain statistics regarding voltage drift for future adjustment/prediction.

At block 250, write data cells, keep track of baseline voltage level, and later readback. At a time of the write to the reference cell, separately store the write event conditions, such as voltage level, time/date of write, and total write and erase cycles to cell. At data read back or data integrity test time, read back these data cells and determine voltage level drift.

In accordance with features of the invention, threshold voltage-drift or resistance drift tolerant moving baseline memory data encoding for robust MLC memory data partial erase is provided prior to re-write of data, whenever an erase is necessary because the baseline can not move further to accommodate the data to be written. For example, partial erase is used, full erase is not used because full erase is both slow and full erase also causes more cell degradation/stress than a partial-erase, with less current during erase for NAND flash, less heating for PCM. For example, partial erase has similar effect as cell voltage drift where all cells in a group change baseline values substantially together.

Referring now to FIG. 2E, operations start for robust MLC memory data partial erase as indicated at a block 252. The MLC memory data partial erase of the invention works if data is rewritten with MB where the exact baseline voltage is not necessarily required as long as all cells have same baseline; imprecision during erase is acceptable, and in some cases can be about 10 times faster than normal full erase for NAND flash. See FIGS. 11A, 11B, 11C for example of partial erase.

As indicated at a block 254, optionally data re-write after partial erase is blind. For example, partial-erase is assumed to reduce cell voltage to a sufficient level and all cells are re-written at new voltage. As indicated at a block 256, alternatively data re-write after partial erase is not blind. For example, cell voltage is read prior to the re-write of the cells. Read can be done for all cells or a statistical sampling of the cells.

As indicated at a block 258, data re-write after both partial erase and pre-write of cells to a new baseline voltage. For example, in a conceptual description, cells are pre-written to a new baseline before new data write. For example, cells are pre-written to a next even baseline. In actual implementation, the final charge to which each cell will be programmed is reached in a single program command.

As indicated at a block 260, duration and/or voltage for data partial-erase is adapted to age/degradation of cells. For example, statistical sampling of cells is used for likely necessary partial-erase duration. For example, data kept for number of erase cycles, write cycles, and age of chip can help to determine duration and/or voltage of the partial-erase.

FIGS. 3A, 3B, and 3C respectively illustrate a start operation, with all cells fully erased for 2-bit NAND cells, 3-bit NAND cells and 4-bit NAND cells respectively generally designated by the reference character 300, 310, 320 in accordance with embodiments of the invention. In FIG. 3A, the respective start operation 300, 310, 320 with all cells fully erased includes a V-read less than the illustrated Vth-1 or V-read<Vth-1 for each of 2-bit NAND cells, 3-bit NAND cells and 4-bit NAND cells.

FIG. 4A respectively illustrates 2-state moving baseline write (MBW) cycles for 2-bit NAND cells, 3-bit NAND cells and 4-bit NAND cells respectively generally designated by the reference character 400, 410, 420 in accordance with embodiments of the invention.

FIGS. 5A, 5B, 5C, and 5D respectively illustrate example moving baseline coding operations of start all cells fully erased, first write, second write and third write for a 2-state, 2-bit MLC cell example respectively generally designated by the reference character 500, 510, 520, 530 in accordance with embodiments of the invention. In FIG. 5A, with all cells fully erased in the start state 500, V-read<Vth-1.

In accordance with features of a preferred embodiment of the invention, using threshold-voltage-drift or resistance-drift tolerant moving baseline memory data encoding for robust MLC memory 114, enables the readback decoder to read all data cell bits, and the decoder expects all the cells to be in only two different levels, and assigns a 0 for the cells with the lower threshold and a 1 to the cells with the higher threshold, irrespective to exactly what those levels are. The readback decoder does not need to know a priori what threshold level to use for the decision. The readback decoder reads the data cells, and bunches the readback values in two groups, a group of higher threshold and a group of lower threshold, assigning 1s and 0s accordingly. When all cells have the same threshold, either by pre-coding or a flag is set to inform the readback decoder to assign a 1 or a 0.

As illustrated in FIG. 5B, after the first write operation 510, Vth-1 shown as THRESHOLD-1, AND if V-read≥Vth-1, then V-read=1, else V-read=0.

As illustrated in FIG. 5C, after a second write operation 520, Vth-2 shown as THRESHOLD-1, and Vth-1=BASELINE (CHARGES LEVELED) AND if V-read≥Vth-2, then V-read=1, else V-read=0. Charge leveling is a conceptual description only to clarify the fundamental work of moving baseline. With the write command, the NAND flash cells 114 are commanded to program a final target threshold level each cell needs to acquire.

As illustrated in FIG. 5D, after a third write operation 530, Vth-3 shown as THRESHOLD-1, and Vth-2=BASELINE (CHARGES LEVELED) AND if V-read≥Vth-3, then V-read=1, else V-read=0.

Figure 6A:
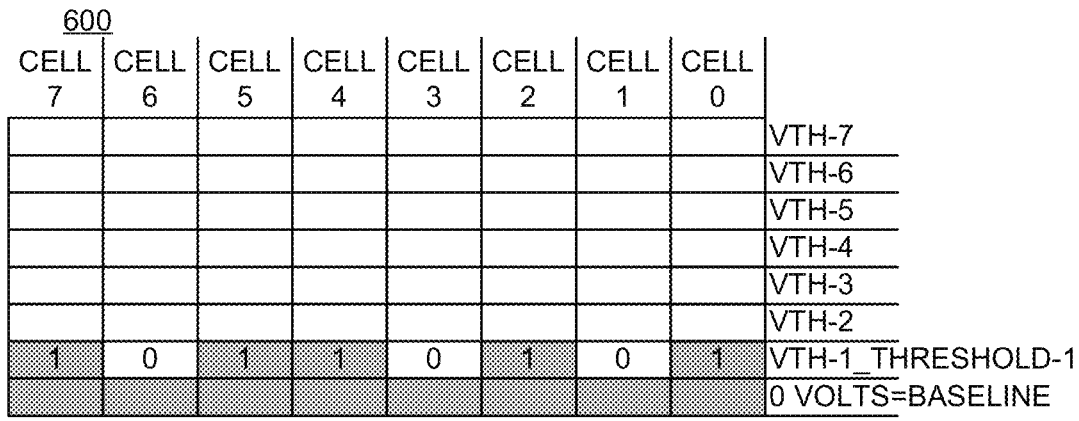
Figure 6B:
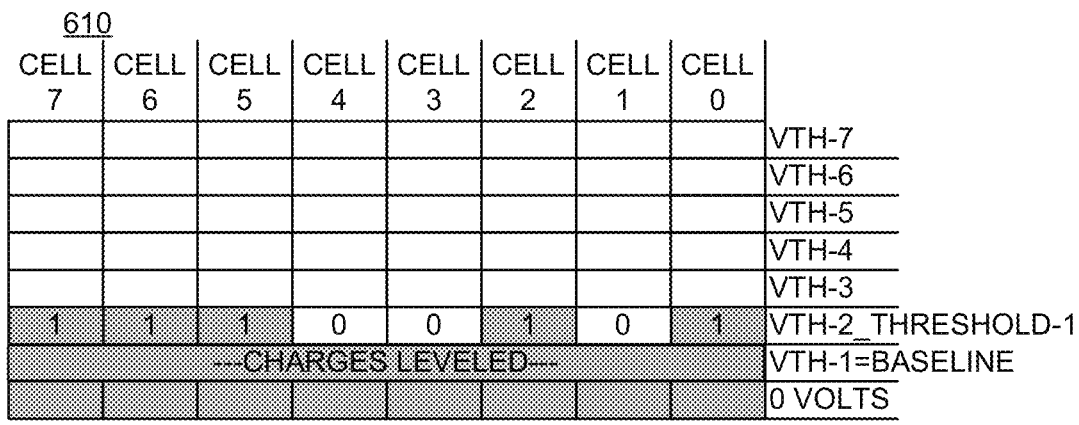

FIGS. 6A, 6B, and 6C respectively illustrate example moving baseline coding operations of first write, second write and seventh write for a 2-state, 3-bit MLC cell example respectively generally designated by the reference character 600, 610, 620 in accordance with embodiments of the invention.

As illustrated in FIG. 6A, after a first write operation 600, Vth-1 shown as THRESHOLD-1, and 0 VOLTS=BASELINE if V-read≥Vth-1, then V-read=1, else V-read=0.

As illustrated in FIG. 6B, after a second write operation 610, Vth-2 shown as THRESHOLD-1, and Vth-1=BASELINE (CHARGES LEVELED) AND if V-read≥Vth-2, then V-read=1, else V-read=0.

As illustrated in FIG. 6C, after a seventh write operation 620, Vth-6 shown as THRESHOLD-1, and Vth-6=BASELINE (CHARGES LEVELED) AND if V-read≥Vth-7, then V-read=1, else V-read=0.

In accordance with features of other embodiments of the invention, the threshold-voltage-drift or resistance-drift tolerant moving baseline memory data encoding for robust MLC memory 114 can include a selected multiple state level such as a 3-state or a 4-state MB memory data other than the 2-state MB memory data, which has available data values of a 1 or a 0 for each cell in a group of cells. For example, the 3-state MB memory data, such as illustrated in FIGS. 7A-7C and FIGS. 8A-8C includes available data values of a 2, a 1, or a 0 for each cell. For another example, the 4-state MB memory data, such as illustrated in FIGS. 9A-9B includes available data values of a 3, a 2, a 1, or a 0 for each cell.

FIGS. 7A, 7B, and 7C respectively illustrate example moving baseline coding operations of first write, second write and third write respectively generally designated by the reference character 700, 710, 720 for a 3-state, 3-bit MLC cell example in accordance with embodiments of the invention.

As illustrated in FIG. 7A, after a first write operation 700, Vth-1 shown as THRESHOLD-1, Vth-2 shown as THRESHOLD-2, and 0 VOLTS=BASELINE and if V-read≥Vth-2, then V-read=2, else if V-read≥Vth-1, then V-read=1, else V-read=0.

As illustrated in FIG. 7B, after a second write operation 710, Vth-3 shown as THRESHOLD-1, Vth-4 shown as THRESHOLD-2, and Vth-2=BASELINE (CHARGES LEVELED) and if V-read≥Vth-4, then V-read=2, else if V-read≥Vth-3, then V-read=1, else V-read=0.

As illustrated in FIG. 7C, after a seventh write operation 720, Vth-5 shown as THRESHOLD-1, Vth-6 shown as THRESHOLD-2, and Vth-4=BASELINE (CHARGES LEVELED) and V-read≥Vth-6, then V-read=2, else if V-read≥Vth-5, then V-read=1, else V-read=0.

FIGS. 8A, 8B, and 8C respectively illustrate example moving baseline coding operations of first write, second write and seventh write respectively generally designated by the reference character 800, 810, 820 for a 3-state, 4-bit MLC cell example in accordance with embodiments of the invention.

As illustrated in FIG. 8A, after a first write operation 800, Vth-1 shown as THRESHOLD-1, Vth-2 shown as THRESHOLD-2, and 0 VOLTS=BASELINE and if V-read≥Vth-2, then V-read=2, else if V-read≥Vth-1, then V-read=1, else V-read=0.

As illustrated in FIG. 8B, after a second write operation 810, Vth-3 shown as THRESHOLD-1, Vth-4 shown as THRESHOLD-2, and Vth-2=BASELINE (CHARGES LEVELED) and if V-read≥Vth-4, then V-read=2, else if V-read≥Vth-3, then V-read=1, else V-read=0.

As illustrated in FIG. 8C, after a seventh write operation 820, Vth-13 shown as THRESHOLD-1, Vth-14 shown as THRESHOLD-2, and Vth-12=BASELINE (CHARGES LEVELED) and V-read≥Vth-14, then V-read=2, else if V-read≥Vth-13, then V-read=1, else V-read=0.

FIGS. 9A, and 9B respectively illustrate example moving baseline coding operations of first write, and fifth write respectively generally designated by the reference character 900, 910 for a 4-state, 4-bit MLC cell example in accordance with embodiments of the invention.

As illustrated in FIG. 9A, after the first write operation 900, Vth-1 shown as THRESHOLD-1, Vth-2 shown as THRESHOLD-2, Vth-3 shown as THRESHOLD-3, and 0 VOLTS=BASELINE and if V-read≥Vth-3, then V-read=3, else if V-read≥Vth-2, then V-read=2, else if V-read≥Vth-1, then V-read=1, else V-read=0.

As illustrated in FIG. 9B, after a fifth write operation 910, Vth-12 shown as THRESHOLD-1, Vth-13 shown as THRESHOLD-2, Vth-14 shown as THRESHOLD-3, and Vth-11=BASELINE (CHARGES LEVELED) and if V-read≥Vth-14, then V-read=2, else if V-read≥Vth-13, then V-read=1, else V-read=0.

FIGS. 10A, and 10B respectively illustrate example voltage drift with operations of data written, and data read respectively generally designated by the reference character 1000, 1010 for a 2-bit MLC NAND cell example in accordance with embodiments of the invention.

As illustrated in FIG. 10A, after the data written operation 1000, Vth-4 shown as THRESHOLD, and Vth-3=BASELINE and if V-read≥Vth-4, then V-read=1, else V-read=0.

As illustrated in FIG. 10B, after the data read operation 1010 including example voltage drift, Vth-2 shown as Vth-2' shown as THRESHOLD, and Vth-1'=BASELINE and if V-read≥Vth-2', then V-read=1, else V-read=0. Data is recoverable if voltage drift is substantially the same between the cells, with ability to adjust threshold voltages for read data used as needed.

FIGS. 11A, 11B, and 11C, respectively illustrate example partial-erase with operations of third data write, fast partial erase, and data re-write respectively generally designated by the reference character 1100, 1110, 1120 for a 2-bit MLC NAND cell example in accordance with embodiments of the invention.

As illustrated in FIG. 11A, with a third data write operation 1100, Vth-3 shown as THRESHOLD, and Vth-2=BASELINE and if V-read≥Vth-3, then V-read=1, else V-read=0.

As illustrated in FIG. 11B, the data partial erase operation 1110 is shown, where there is potentially uneven erasure between cells.

As illustrated in FIG. 11C, the data re-write operation 1120 is shown following the partial erase operation 1110. For the data re-write operation 1120 Vth-3 shown as THRESHOLD, and Vth-2=BASELINE (CHARGES LEVELED) and if V-read≥Vth-3, then V-read=1, else V-read=0.

FIGS. 12A and 12B respectively illustrate example change to threshold resolution with un-degraded cell and degraded cell respectively generally designated by the reference character 1200, 1210 for a 2-bit MLC NAND cell example in accordance with embodiments of the invention.

As illustrated in FIG. 12A, with the un-degraded cell example 1200, there are three threshold levels, Vth-1, Vth-2, and Vth-3 for three moving baseline writes. In FIG. 12B, with the degraded cell example 1210, there are two threshold levels, Vth-1', and Vth-2' for two moving baseline writes.

FIGS. 13A, and 13B, 13C, and 13D respectively illustrate example change to threshold resolution with un-degraded cell and degraded cell respectively generally designated by the reference character 1300, 1310, 1320, and 1330 for a 3-bit MLC NAND cell example in accordance with embodiments of the invention.

As illustrated in FIG. 13A, with the un-degraded cell example 1300, there are five threshold levels, Vth-1, Vth-2, Vth-3, Vth-4, and Vth-5 for five moving baseline writes. As illustrated in FIG. 13B, with the degraded cell example 1310, there are four threshold levels, Vth-1', Vth-2', Vth-3', and Vth-4' for four moving baseline writes. As illustrated in FIG. 13C, with the degraded cell example 1320, there are three threshold levels, Vth-1', Vth-2', and Vth-3' for three moving baseline writes. In FIG. 13D, with the degraded cell example 1330, there are two threshold levels, Vth-1', and Vth-2' for two moving baseline writes.

Referring to FIG. 14, there is shown a chart illustrating example parameter data for example MLC cell examples generally designated by the reference character 1400 in accordance with embodiments of the invention. The example parameter data for example MLC cell examples 1400 includes respective example levels per cell 1402, numerical base 1404, number of threshold levels 1406, available moving baseline writes is cells are un-degraded after full erase 1408, and range of available moving baseline writes is cells are degraded after full erase 1410.

FIGS. 15A, and 15B illustrate example voltage leak indication with operations of data written, and data read back respectively generally designated by the reference character 1500, 1510 for a 2-bit MLC NAND cell example in accordance with embodiments of the invention.

As illustrated in FIG. 15A, after the first write operation 1500, Vth-3 shown as THRESHOLD-1, and Vth-2=BASELINE if V-read≥Vth-3, then V-read=1, else V-read=0.

As illustrated in FIG. 15B, with the voltage leak indication, the data read back operation 1510, Vth-3 shown as THRESHOLD-1, and Vth-2=BASELINE if V-read<Vth-2, then an Error can result indicated by ?, where voltage leakage has occurred. The moving baseline decoder can either flag the leak as an error or assign to the leaking cell a "0" or "1" with different probabilities and pass this to a soft decoder/error correcting system for final decision on the correct cell content. These leak events can also be used by a management system to attribute an age for the part according to the frequency these leaky bits occur, which might at a pre-defined threshold recommend for the replacement of the whole memory part.

While the Moving Baseline (MB) memory data encoding of the invention has been generally described with respect to illustrative MLC NAND Flash cases, one skilled in the art will recognize that MB memory data encoding of the invention also is used advantageously with multi-level PCM memory without departing from the spirit or scope of the invention.

Figure 16:
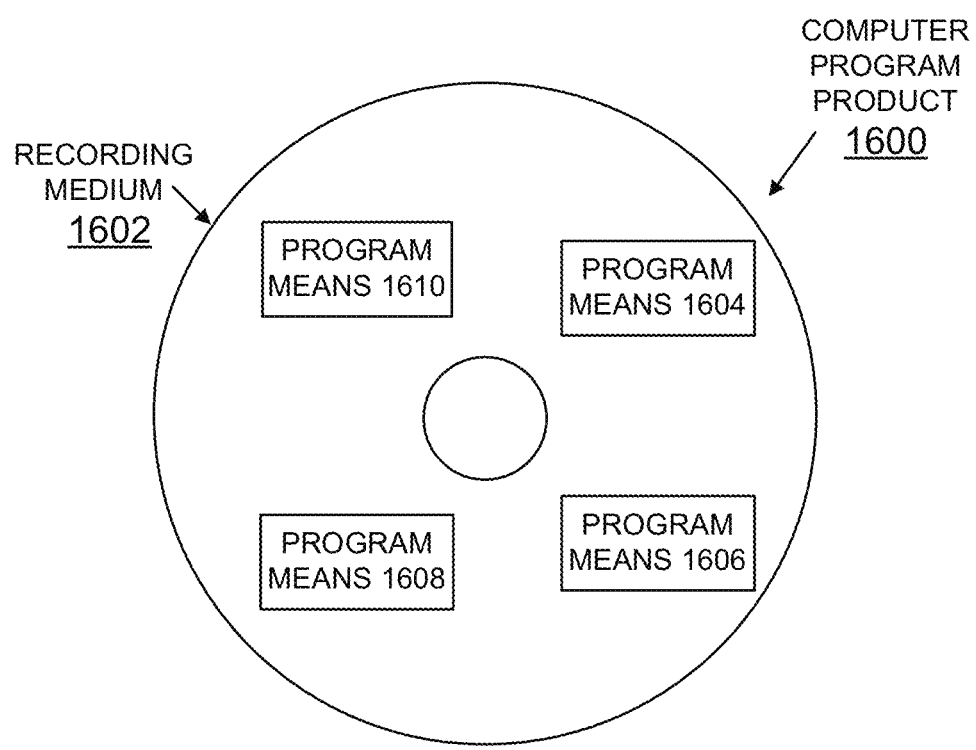
FIG. 16 is a block diagram illustrating a computer program product in accordance with embodiments of the invention.

Referring now to FIG. 16, an article of manufacture or a computer program product 1600 of the invention is illustrated. The computer program product 1600 includes a computer readable recording medium 1602, such as, a floppy disk, a high capacity read only memory in the form of an optically read compact disk or CD-ROM, a tape, or another similar computer program product. Computer readable recording medium 1602 stores program means or control code 1604, 1606, 1608, 1610 on the medium 1602 for carrying out the methods for implementing enhanced data write, enhanced data read, and enhanced data partial-erase for multi-level cell (MLC) memory using threshold-voltage-drift or resistance-drift tolerant moving baseline memory data encoding of the embodiments of the invention in the system 100 of FIG. 1.

A sequence of program instructions or a logical assembly of one or more interrelated modules defined by the recorded program means or control code 1604, 1606, 1608, 1610, direct SSD controller 106 of the system 100 for implementing enhanced data write, enhanced data read, and enhanced data partial-erase for multi-level cell (MLC) memory using threshold-voltage-drift or resistance-drift tolerant moving baseline memory data encoding of the embodiments of the invention.

While the present invention has been described with reference to the details of the embodiments of the invention shown in the drawing, these details are not intended to limit the scope of the invention as claimed in the appended claims.

What is claimed is:

1. A method for implementing data partial erase for multi-level cell (MLC) memory comprising:
    performing a data partial erase for data written to the MLC memory using threshold-voltage-drift or resistance-drift tolerant moving baseline memory data encoding; and
    performing a data re-write after the data partial erase using threshold-voltage-drift or resistance-drift tolerant moving baseline memory data encoding.

2. The method for implementing data partial erase as recited in claim 1 wherein performing the data re-write after the partial erase includes reading MLC memory cells before performing the data re-write.

3. The method for implementing data partial erase as recited in claim 1 wherein performing the data re-write after the partial erase includes performing a data pre-write using a new voltage baseline before performing the data re-write.

4. The method for implementing data partial erase as recited in claim 1 wherein performing the data partial erase includes providing a duration for a data partial erase cycle based upon a degradation of the MLC memory cells.

5. The method for implementing data partial erase as recited in claim 4 wherein performing the data partial erase includes providing a voltage level for the data partial erase cycle based upon the degradation of the MLC memory cells.

6. The method for implementing data partial erase as recited in claim 5 includes identifying the degradation of the MLC memory cells using sampling of cells.

7. The method for implementing data partial erase as recited in claim 5 includes identifying degradation of the MLC memory cells using stored parameter data including a number of write cycles.

8. An apparatus for implementing data partial erase for multi-level cell (MLC) memory comprising:
    a controller;
    said controller performing a data partial erase for data written to the MLC memory using threshold-voltage-drift or resistance-drift tolerant moving baseline memory data encoding; and
    said controller performing a data re-write after the partial erase to the MLC memory using threshold-voltage-drift or resistance-drift tolerant moving baseline memory data encoding.

9. The apparatus as recited in claim 8 includes control code stored on a computer readable medium, and wherein said controller uses said control code for implementing data partial erase.

10. The apparatus as recited in claim 8 wherein said controller performing the data re-write after the partial erase includes said controller reading MLC memory cells before performing the data re-write.

11. The apparatus as recited in claim 8 wherein said controller performing the data re-write after the partial erase includes said controller performing a data pre-write using a new voltage baseline before performing the data re-write.

12. The apparatus as recited in claim 8 wherein said controller performing the data partial erase includes said controller providing a duration for a data partial erase cycle based upon degradation of the MLC memory cells.

13. The apparatus as recited in claim 12 wherein said controller performing the data partial erase includes providing a voltage level for the data partial erase cycle based upon the degradation of the MLC memory cells.

14. The apparatus as recited in claim 13 includes said controller identifying the degradation of the MLC memory cells using sampling of cells.

15. The apparatus as recited in claim 13 includes said controller identifying the degradation of the MLC memory cells using stored parameter data including a number of write cycles.

16. A data storage device comprising:
    a multi-level cell memory;
    a controller using a moving baseline memory data encoding control for implementing data partial erase;
    said controller performing a data partial erase for data written to the MLC memory using threshold-voltage-drift or resistance-drift tolerant moving baseline memory data encoding; and
    said controller performing a data re-write after the partial erase to the MLC memory using threshold-voltage-drift or resistance-drift tolerant moving baseline memory data encoding.

17. The data storage device as recited in claim 16, wherein said controller performing the data re-write after the partial erase includes said controller reading MLC memory cells before performing the data re-write.

18. The data storage device as recited in claim 16, wherein said controller performing the data re-write after the partial erase includes said controller performing a data pre-write using a new voltage baseline before performing the data re-write.

19. The data storage device as recited in claim 16, wherein said controller performing the data partial erase includes said controller providing a duration for a data partial erase cycle based upon degradation of the MLC memory cells.

20. The data storage device as recited in claim 19, wherein said controller performing the data partial erase includes providing a voltage level for the data partial erase cycle based upon the degradation of the MLC memory cells.

* * * * *